United States Patent
Qian et al.

(10) Patent No.: US 11,189,495 B2
(45) Date of Patent: Nov. 30, 2021

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Yafeng Qian, Shanghai (CN); Ying Li, Shanghai (CN); Lihua Ding, Shanghai (CN); Jiaxi Li, Shanghai (CN); Wendong Liu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 17/036,205

(22) Filed: Sep. 29, 2020

(65) Prior Publication Data
US 2021/0210351 A1     Jul. 8, 2021

(30) Foreign Application Priority Data

Jan. 6, 2020    (CN) .......................... 202010011099.0

(51) Int. Cl.
*H01L 21/28*      (2006.01)
*H01L 21/02*      (2006.01)
*H01L 21/20*      (2006.01)

(52) U.S. Cl.
CPC .. *H01L 21/28238* (2013.01); *H01L 21/02282* (2013.01); *H01L 21/20* (2013.01)

(58) Field of Classification Search
CPC .............. H01L 21/02282; H01L 21/20; H01L 21/28238
See application file for complete search history.

(56) References Cited

U.S. PATENT DOCUMENTS

| | | | | |
|---|---|---|---|---|
| 2005/0208744 A1* | 9/2005 | Jeon | ...................... | H01L 27/115 438/593 |
| 2009/0298247 A1* | 12/2009 | Kim | .................... | H01L 29/6653 438/294 |
| 2012/0295409 A1* | 11/2012 | Yun | ................... | H01L 27/11582 438/268 |
| 2019/0164841 A1* | 5/2019 | St. Amour | ........ | H01L 29/66795 |
| 2020/0098781 A1* | 3/2020 | Xiao | ................. | H01L 27/11556 |

* cited by examiner

*Primary Examiner* — Mohammed Shamsuzzaman
(74) *Attorney, Agent, or Firm* — Anova Law Group, PLLC

(57) ABSTRACT

A semiconductor structure and a method for forming the semiconductor structure are provided. The method includes: providing a to-be-etched layer including a first region; forming a first pattern material layer on the to-be-etched layer; forming a sacrificial layer on the first pattern material layer; forming a first opening in the sacrificial layer over the first region, where the first opening exposes a first portion of the first pattern material layer; forming a first doped region in the first pattern material layer using the sacrificial layer as a mask; forming a second opening in the sacrificial layer over the first region, where the second opening exposes a second portion of the first pattern material layer; and forming a second doped region in the first pattern material layer using the sacrificial layer as a mask, where the second doped region is connected with the first doped region.

18 Claims, 6 Drawing Sheets

SEMICONDUCTOR STRUCTURE AND FABRICATION METHOD THEREOF

CROSS-REFERENCE TO RELATED APPLICATIONS

This application claims the priority of Chinese patent application No. 202010011099.0, filed on Jan. 6, 2020, the entirety of which is incorporated herein by reference.

FIELD OF THE DISCLOSURE

The present disclosure generally relates to the field of semiconductor manufacturing technology and, more particularly, relates to a semiconductor structure and a fabrication method thereof.

BACKGROUND

In the process of forming a semiconductor product, a pattern is often transferred from a mask to a surface of a silicon wafer through a photolithography process, to form the semiconductor product that meets the design requirements. During the photolithography process, in an exposure step, light is first irradiated onto a to-be-etched layer coated with photoresist through a light-transmitting region in the mask, and the photoresist undergoes chemical reactions under the irradiation of the light. Then, in a development step, because the irradiated and non-irradiated photoresist has different dissolution degree in the developer, a photolithography pattern is formed to achieve the transfer of the mask pattern. Ultimately, in an etching step, based on the photolithography pattern formed by the photoresist layer, the to-be-etched layer is etched to further transfer the mask pattern to the to-be-etched layer.

However, the accuracy of the pattern transferred to the to-be-etched layer is still poor, causing poor device performance of the semiconductor product. The disclosed methods and device structures are directed to solve one or more problems set forth above and other problems.

BRIEF SUMMARY OF THE DISCLOSURE

One aspect of the present disclosure includes a method for forming a semiconductor structure, including: providing a to-be-etched layer, where the to-be-etched layer includes a first region; forming a first pattern material layer on the to-be-etched layer; forming a sacrificial layer on the first pattern material layer; forming a first opening in the sacrificial layer over the first region of the to-be-etched layer, where the first opening exposes a first portion of a surface of the first pattern material layer over the first region; after forming the first opening, forming a first doped region in the first pattern material layer using the sacrificial layer as a mask; after forming the first doped region, forming a second opening in the sacrificial layer over the first region of the to-be-etched layer, where the second opening exposes a second portion of the surface of the first pattern material layer over the first region; and after forming the second opening, forming a second doped region in the first pattern material layer using the sacrificial layer as a mask, where the second doped region is connected with the first doped region.

Optionally, the method further includes: after forming the second doped region, removing the sacrificial layer; after removing the sacrificial layer, forming a first pattern layer, where the first pattern layer includes the first doped region and the second doped region, and the first pattern layer is located over the first region of the to-be-etched layer; and etching the first region of the to-be-etched layer using the first pattern layer as a mask.

Optionally, forming the first opening includes: forming a second pattern layer on the sacrificial layer, where the second pattern layer exposes a first portion of a surface of the sacrificial layer over the first region; and using the second pattern layer as a mask, etching the sacrificial layer until the surface of the first pattern material layer is exposed.

Optionally, forming the second opening includes: after forming the first doped region, forming a first barrier layer in the first opening; after forming the first barrier layer, forming a third pattern layer on surfaces of the first barrier layer and the sacrificial layer, where the third pattern layer exposes a second portion of a surface of the sacrificial layer over the first region; and using the third pattern layer as a mask, etching the sacrificial layer until the surface of the first pattern material layer is exposed.

Optionally, forming the second opening includes: after forming the first doped region, forming a first barrier layer in the first opening; after forming the first barrier layer, forming a third pattern layer on surfaces of the first barrier layer and the sacrificial layer, where the third pattern layer exposes a second portion of a surface of the sacrificial layer over the first region and a portion of the surface of the first barrier layer, and the exposed surface of the sacrificial layer is connected with the exposed surface of the first barrier layer; and using the third pattern layer as a mask, etching the sacrificial layer until the surface of the first pattern material layer is exposed.

Optionally, after removing the sacrificial layer and before forming the first pattern layer, the method further includes performing a surface cleaning process on the first pattern material layer.

Optionally, forming the first pattern layer includes after removing the sacrificial layer, etching the first pattern material layer.

Optionally, etching the first pattern material layer includes a wet etching process; and the wet etching process has an etching rate of the first pattern material layer higher than an etching rate of the first doped region and the second doped region.

Optionally, forming the first doped region includes a first ion implantation process.

Optionally, forming the second doped region includes a second ion implantation process.

Optionally, a type of ions doped in the first doped region is same as a type of ions doped in the second doped region.

Optionally, the first opening has a first projection on the to-be-etched layer; and the second opening has a second projection on the to-be-etched layer. The first projection and the second projection are arranged at intervals along a first direction, and a distance between the first projection and the second projection is less than approximately 20 nm.

Optionally, the first opening has a first projection on the to-be-etched layer; and the second opening has a second projection on the to-be-etched layer. The first projection and the second projection are arranged along a first direction, the first projection partially overlaps the second projection, and in the first direction, a distance between edges of an overlapped portion of the first projection and the second projection is less than approximately 20 nm.

Optionally, in the first direction, a width of the first projection is in a range of approximately 30 nm 50 nm, and a width of the second projection is in a range of approximately 30 nm-50 nm.

Optionally, the to-be-etched layer further includes a second region. The method further includes: forming a fourth pattern layer over the second region of the to-be-etched layer, where in a second direction perpendicular to the first direction, a projection of the fourth pattern layer on the to-be-etched layer has a first length, and the first length is greater than approximately 50 nm; and using the fourth pattern layer as a mask, etching the second region of to-be-etched layer.

Optionally, the sacrificial layer includes a sacrificial barrier layer on the first pattern material layer, and an anti-reflection layer on the sacrificial barrier layer.

Optionally, the first pattern material layer is made of a material including photoresist.

Optionally, ions doped in the first doped region include boron ions, boron fluoride ions, indium ions, phosphorus ions, arsenic ions, antimony ions, or a combination thereof; and ions doped in the second doped region include boron ions, boron fluoride ions, indium ions, phosphorus ions, arsenic ions, antimony ions, or a combination thereof.

Optionally, the first pattern layer further includes a third doped region.

Another aspect of the present disclosure includes a semiconductor structure formed by any one of the above-disclosed methods.

The disclosed embodiments may have following beneficial effects. The disclosed embodiments may have following beneficial effects. In the disclosed method for forming the semiconductor device, the first opening and the second opening may be formed, and the first doped region and the second doped region that are connected to each other may be formed through the first opening and the second opening. Therefore, in an extension direction where the first doped region is connected to the second doped region, through the small-sized first opening and the second opening, a mask with a large size in the extension direction, i.e., the mask including the first doped region and the second doped region, may be subsequently formed. Therefore, the pattern having a large size in the extension direction may be transferred to the to-be-etched layer.

Further, because the first opening and the second opening have a substantially small size in the first direction, when forming the pattern layer of the first opening and the second opening by exposing the photoresist layer through an exposure step, the obtained pattern layer may have a substantially high-precision. Therefore, the formed first opening and the second opening may have high pattern accuracy and desired topography. The first doped region and the second doped region formed through the first opening and the second opening may have high pattern accuracy and desired topography. In other words, the subsequently formed first pattern layer including the first doped region and the second doped region may have high pattern accuracy and desired topography, thereby improving the accuracy of the pattern transferred to the to-be-etched layer, and improving the device performance of the semiconductor structure.

Further, because the first projection and the second projection are arranged at intervals in the first direction, and the distance between the first projection and the second projection is less than approximately 20 nm, a distance between the first opening and the second opening may be substantially small. Therefore, when forming the first doped region and the second doped region, the diffusion of doped ions may connect the first doped region and the second doped region.

The first projection and the second projection may be arranged along the first direction, and the first projection may partially overlap the second projection. Further, in the first direction, a distance between the edges of the overlapped portion of the first projection and the second projection may be less than approximately 20 nm. Therefore, on the one hand, a mask layer with a pattern size larger than the pattern size of the first opening or the second opening may be subsequently formed; and on the other hand, the maximum size of the mask layer may be controlled, thereby forming a mask layer with an appropriate pattern size.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
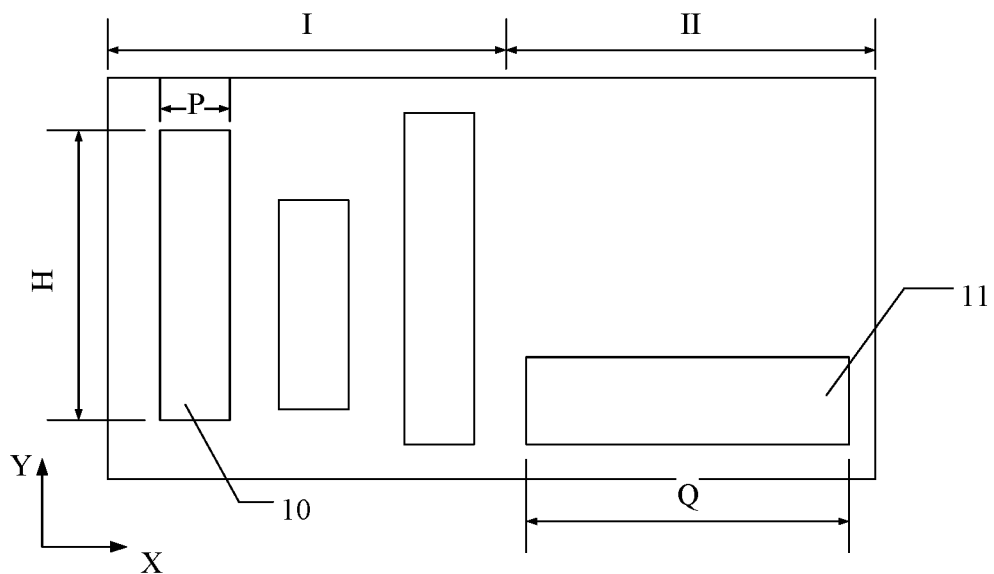
FIG. 1 illustrates a schematic top-view of a mask.

FIG. 1 illustrates a schematic top-view of a mask. Referring to FIG. 1, a mask includes a region I and a region II. In the region I, the mask has a plurality of first openings 10. In the region II, the mask has a second opening 11.

In one embodiment, both the first opening 10 and the second opening 11 serve as light-transmitting region of the mask. Therefore, through the exposure step, light is capable of passing through the first opening 10 and the second opening 11 in the mask to be irradiated onto the silicon wafer coated with photoresist and photochemically reacts with the photoresist. Then, through the development step, because the irradiated and non-irradiated photoresist has different dissolution degree in the developer, a photolithography pattern is formed to achieve the transfer of the mask pattern.

In the above method, the first opening 10 has a substantially large length H in a Y direction and a substantially small length P in a X direction. At the same time, in the entire mask, a quantity of the first openings 10 is greater than a quantity of the second openings 11. Therefore, by adjusting parameters of the light source during the exposure process, the exposure process has a substantially large exposure range and high accuracy in the Y direction. Therefore, the formed lithography patterns corresponding to the plurality of first openings 10 have desired topography.

However, the exposure process cannot juggle the exposure range and accuracy in the Y direction and the X direction at the same time. Because parameters of the light source are adjusted to make the exposure process have a substantially large exposure range and high accuracy in the Y direction, the exposure process has substantially small exposure range and poor accuracy in the X direction. Therefore, when a length Q in the X direction of the second opening 11 in the region II is much greater than a length P in the X direction of the first opening 10, the exposure process has poor contour exposure accuracy for the second opening 11 with a substantially large width Q in the X direction, and the formed photolithography pattern corresponding to the second opening 11 has a poor topography. Therefore, the accuracy of the pattern transferred to the to-be-etched layer is still poor, causing substantially poor device performance of the semiconductor product.

The present disclosure provides a semiconductor structure and a method for forming the semiconductor structure. A first opening and a second opening with substantially small size and desired topography may be formed on a sacrificial layer, and a first pattern layer as a mask layer of the to-be-etched layer may be formed through the first opening and the second opening. Therefore, the accuracy of the pattern transferred to the to-be-etched layer may be improved, thereby improving the device performance of the semiconductor structure.

Figure 11:
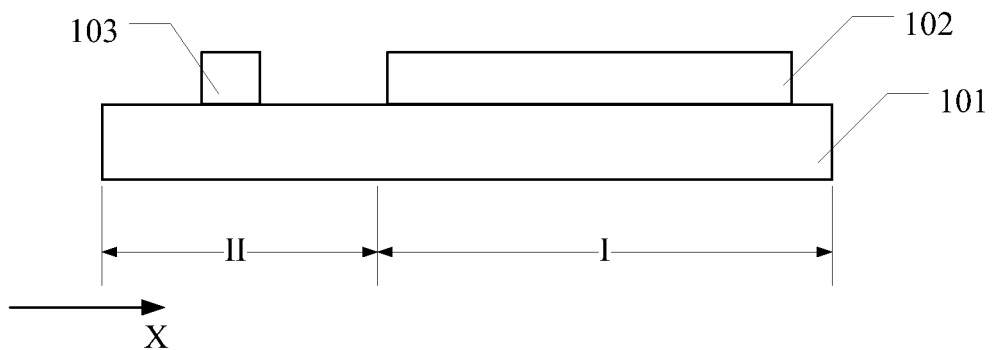
Figure 12:
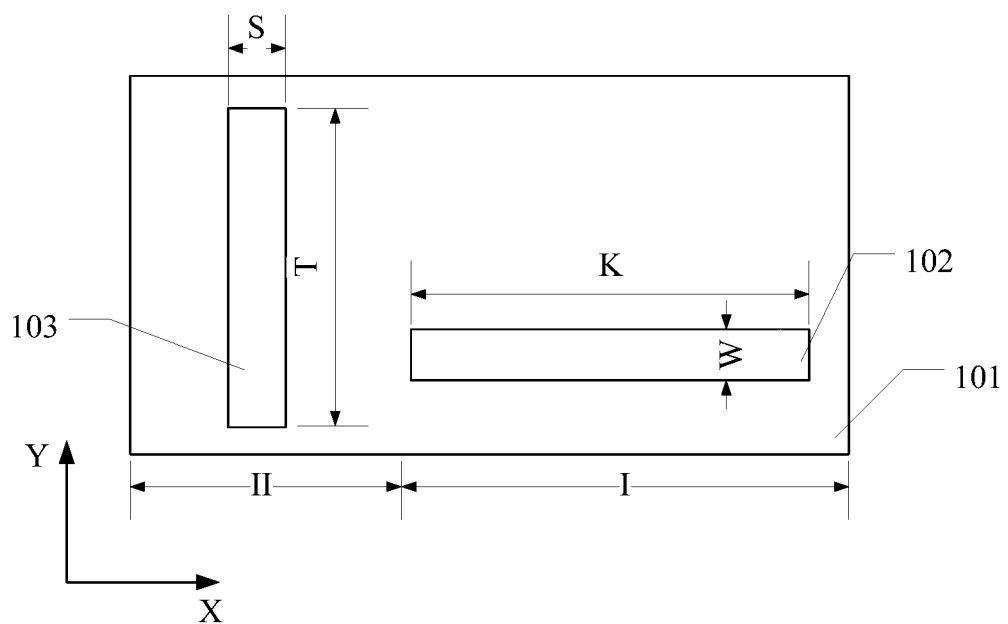
Figure 13:
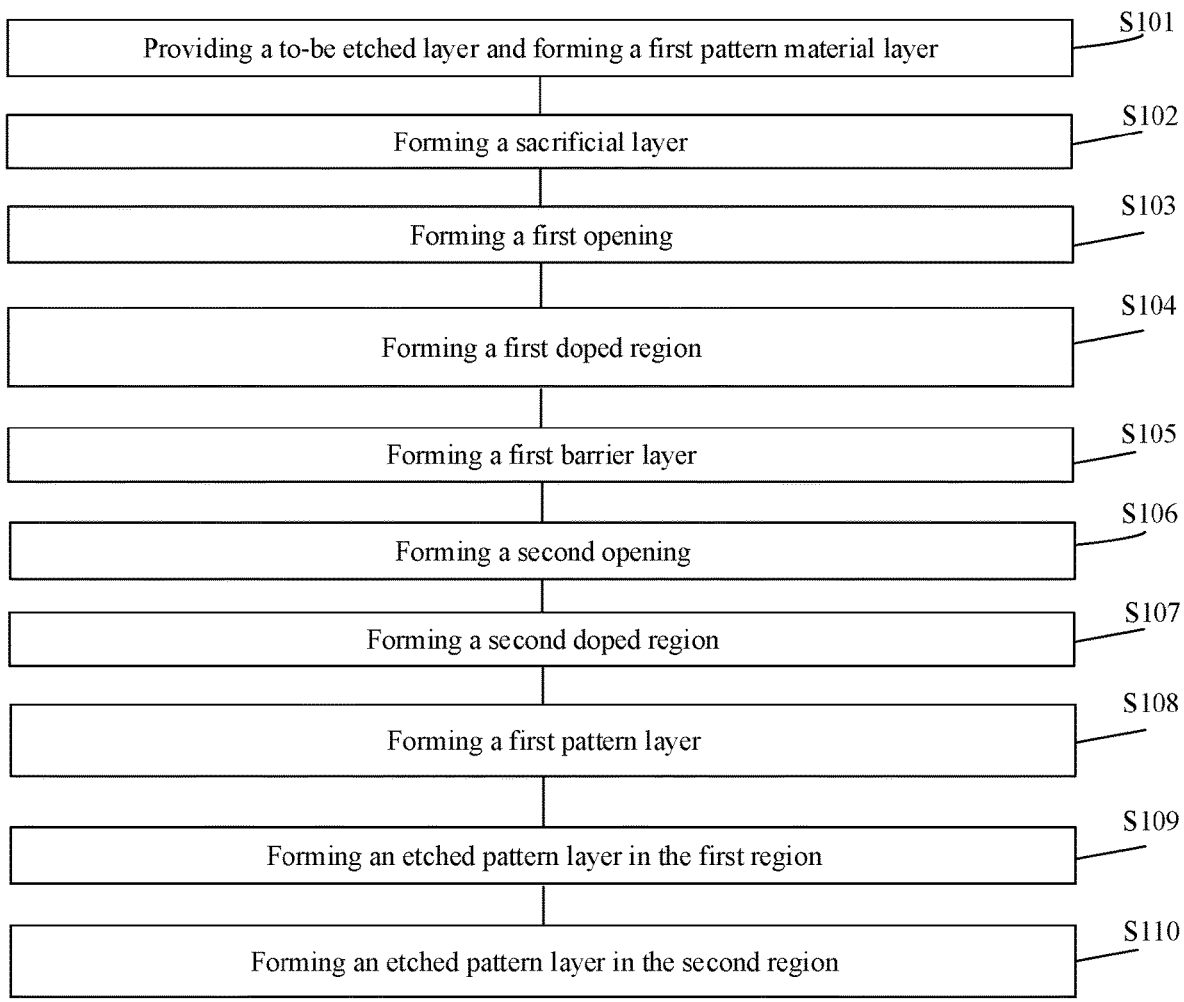
FIG. 13 illustrates a flowchart of an exemplary method for forming a semiconductor structure consistent with various disclosed embodiments of the present disclosure.

FIG. 13 illustrates a flowchart of a method for forming a semiconductor structure consistent with various disclosed embodiments of the present disclosure, and FIGS. 2-12 illustrate semiconductor structures corresponding to certain stages of the fabrication method.

Figure 2:
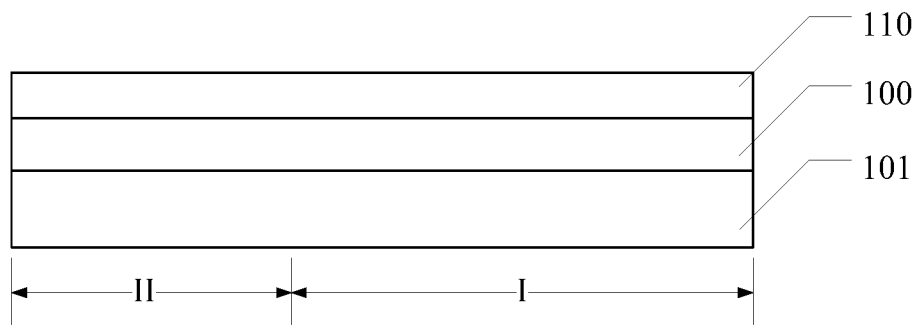
FIGS. 2-12 illustrate cross-sectional views of semiconductor structures corresponding to certain stages for forming an exemplary semiconductor structure consistent with various disclosed embodiments of the present disclosure.

As shown in FIG. 13, at the beginning of the fabrication method, a to-be-etched layer may be provided and a first pattern material layer may be formed (S101). FIG. 2 illustrates a corresponding semiconductor structure.

Referring to FIG. 2, a to-be-etched layer 100 may be provided, and the to-be-etched layer 100 may include a first region I. A first pattern material layer 110 may be formed on the to-be-etched layer 100.

The first pattern material layer 100 may be configured to form a first pattern layer over the first region I. The to-be-etched layer 100 may be made of a material including oxide or nitride. In one embodiment, the to-be-etched layer 100 may be made of silicon oxide.

In one embodiment, the to-be-etched layer 100 may further include a second region II. In another embodiment, the to-be-etched layer may not include the second region.

Forming the first pattern material layer 110 may include a deposition process or a spin coating process. In one embodiment, forming the first pattern material layer 110 may include a chemical vapor deposition process. In another embodiment, the first pattern material layer 110 may be made of a material including amorphous silicon.

In one embodiment, a substrate 101 may be further provided, and the to-be-etched layer 100 may be located the substrate. The substrate 101 may be made of a semiconductor material. In one embodiment, the substrate 101 may be made of a material including silicon. In another embodiment, the substrate may be made of a material including silicon carbide, silicon germanium, a multi-element semiconductor material composed of group III-V elements, silicon-on-insulator (SOI), germanium-on-insulator, or a combination thereof. Further, the multi-element semiconductor material composed of group III-V elements may include InP, GaAs, GaP, InAs, InSb, InGaAs, or InGaAsP, etc.

In one embodiment, the substrate 101 may contain a device layer (not illustrated). The device layer may include a device structure, e.g., a PMOS transistor or an NMOS transistor. The device layer may further include an interconnection structure electrically connected to the device structure, and an insulating layer surrounding the device structure and the interconnection structure.

Figure 3:
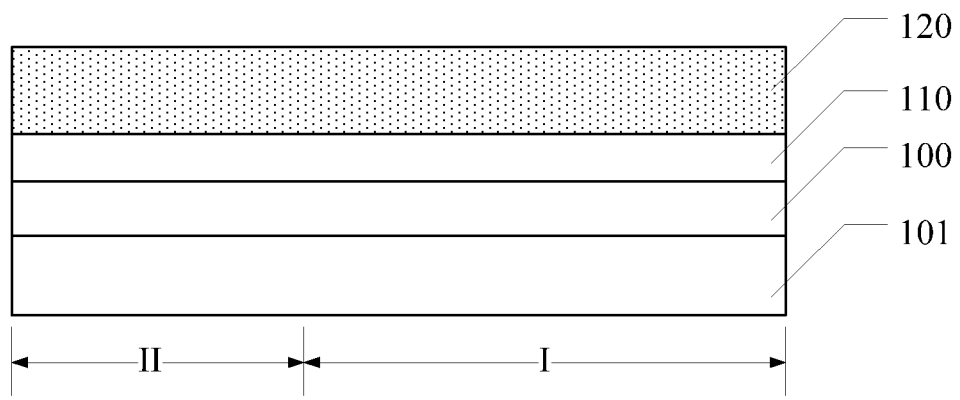

Returning to FIG. 13, after forming the first pattern material layer, a sacrificial layer may be formed (S102). FIG. 3 illustrates a corresponding semiconductor structure.

Referring to FIG. 3, a sacrificial layer 120 may be formed on the first pattern material layer 110. In one embodiment, the sacrificial layer 120 may include a sacrificial barrier layer (not illustrated) formed on the first pattern material layer 110, and an anti-reflection layer (not illustrated) formed on the sacrificial barrier layer.

Forming the sacrificial barrier layer may include a deposition process or a spin coating process. In one embodiment, forming the sacrificial barrier layer may include a spin coating process, and the sacrificial barrier layer may be made of spin-coated carbon.

Forming the anti-reflection layer may include a deposition process or a spin coating process. In one embodiment, the anti-reflection layer may be made of a dielectric material, including one or more of silicon oxide, silicon nitride, hafnium oxide, tantalum oxide, and aluminum oxide.

Figure 4:
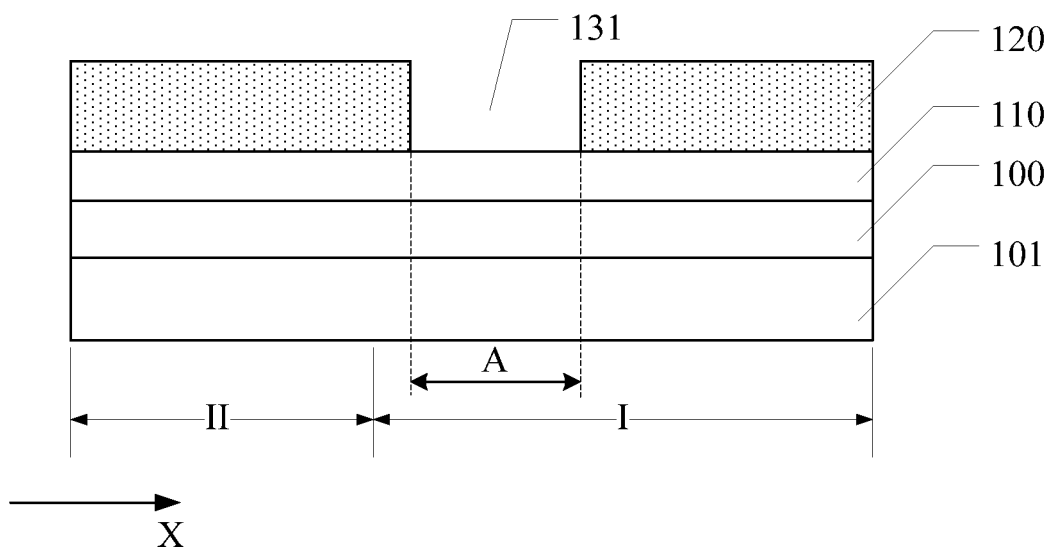

Returning to FIG. 13, after forming the sacrificial layer, a first opening may be formed (S103). FIG. 4 illustrates a corresponding semiconductor structure.

Referring to FIG. 4, a first opening 131 may be formed in the sacrificial layer 120 over the first region I, and the first opening 131 may expose a portion of the surface of the first pattern material layer 110.

In one embodiment, the first opening 131 may have a first projection on the to-be-etched layer 100, and a width A of the first projection in the first direction X may be in a range of approximately 30 nm-50 nm.

If the width A is too small, the first opening may not subsequently cooperate with the second opening to form a large-sized first pattern layer. If the width A is too large, after exposing the photoresist material layer for forming the first opening 131, the accuracy of the obtained pattern of the photoresist layer may be substantially poor, such that the formed first opening 131 may not have desired accuracy and topography. Therefore, the first opening with a width A in an appropriate range may cooperate with the second opening to form the large-sized first pattern layer, and at the same time, may have desired accuracy and topography.

Forming the first opening 131 may include: forming a second pattern layer (not illustrated) on the sacrificial layer 120 (i.e., on a surface of the anti-reflection layer), where the second pattern layer exposes a portion of the surface of the sacrificial layer 120 over the first region I; and using the second pattern layer as a mask, etching the sacrificial layer 120 until the surface of the first pattern material layer 110 is exposed.

In one embodiment, the second pattern layer may be made of photoresist. Forming the second pattern layer may include: forming a first photoresist material layer (not illustrated) on the sacrificial layer 120, and exposing and developing the first photoresist material layer to remove a portion of the first photoresist material layer on the sacrificial layer 120 over the first region I, to form the second pattern layer.

Etching the sacrificial layer 120 may include a dry etching process, a wet etching process, or a combination thereof. In one embodiment, etching the sacrificial layer 120 may include a dry etching process. In one embodiment, after forming the first opening 131, the second pattern layer may be removed. Removing the second pattern layer may include an ashing process.

Figure 5:
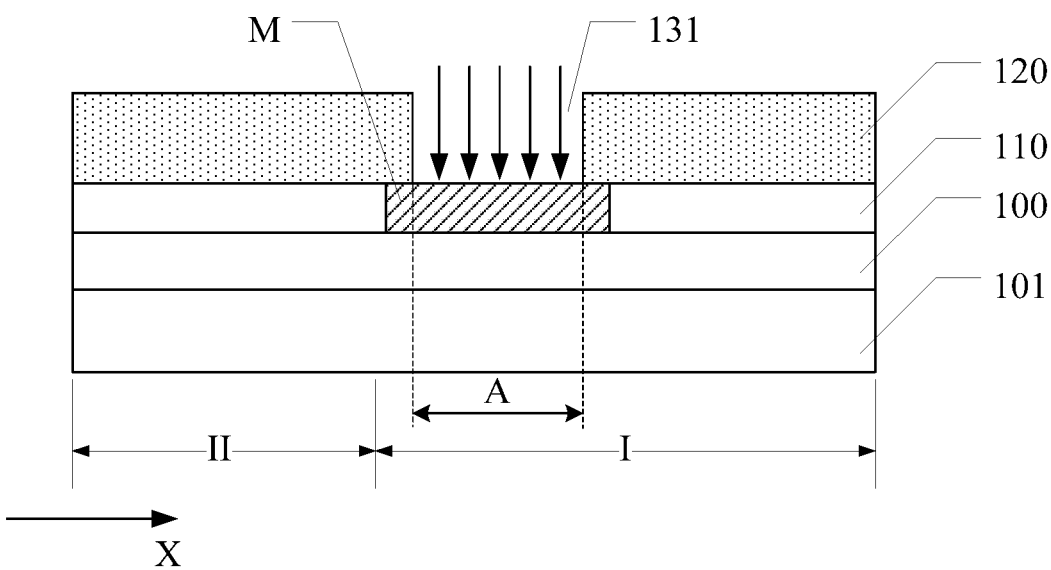

Returning to FIG. 13, after forming the first opening, a first doped region may be formed (S104). FIG. 5 illustrates a corresponding semiconductor structure.

Referring to FIG. 5, after forming the first opening 131, using the sacrificial layer 120 as a mask, a first doped region M may be formed in the first pattern material layer 110. Forming the first doped region M may include a first ion implantation process.

Parameters of the first ion implantation process may include doping ions including boron ions, boron fluoride ions, indium ions, phosphorus ions, arsenic ions, antimony ions, or a combination thereof. Therefore, the ions doped in the first doped region M may include boron ions, boron fluoride ions, indium ions, phosphorus ions, arsenic ions, antimony ions, or a combination thereof. In one embodiment, the ions doped in the first doped region M may include boron ions.

In one embodiment, by adjusting the process parameters of the first ion implantation process and the size of the first opening 131, the first doped region M with a design required size may be formed.

Figure 6:
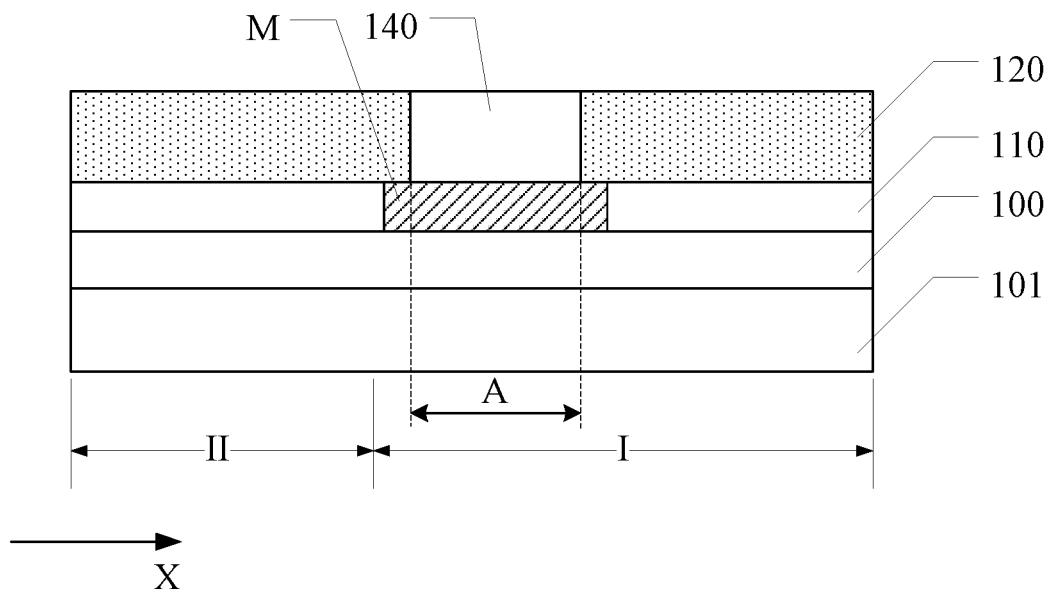

Returning to FIG. 13, after forming the first doped region, a first barrier layer may be formed (S105). FIG. 6 illustrates a corresponding semiconductor structure.

Referring to FIG. 6, after forming the first doped region M, a first barrier layer 140 may be formed in the first opening 131. The first barrier layer 140 may be configured to protect the topography of the first doped region M, thereby reducing the influence of the processes of forming the second opening and the second doped region on the first doped region M.

Forming the first barrier layer 140 may include a deposition process or a spin coating process. In one embodiment, forming the first barrier layer 140 may include a spin coating process. The first barrier layer 140 may be made of a material including spin-coated carbon.

Figure 7:
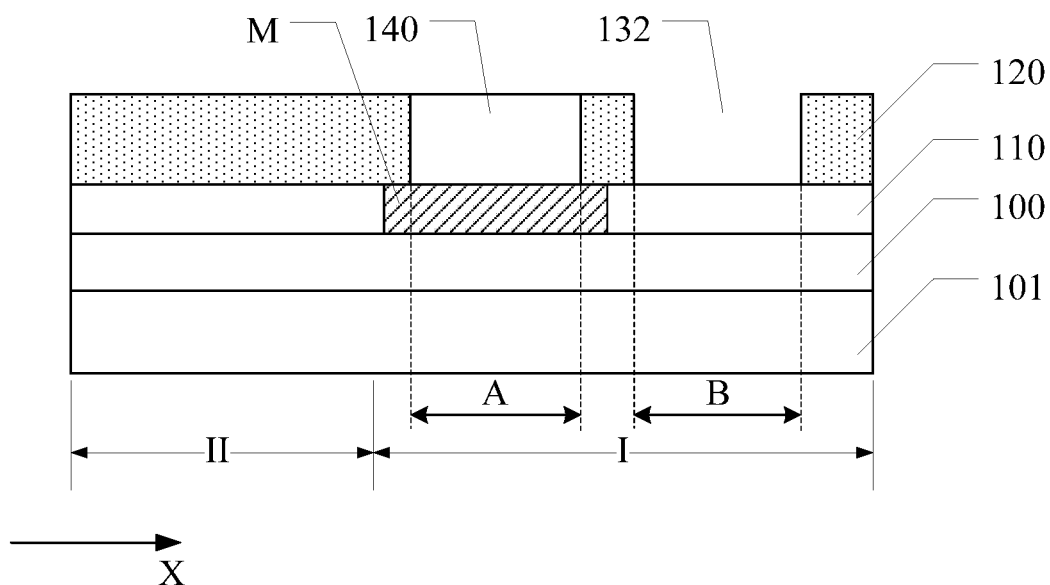

Returning to FIG. 13, after forming the first barrier layer, a second opening may be formed (S106). FIG. 7 illustrates a corresponding semiconductor structure.

Referring to FIG. 7, after forming the first barrier layer 140, a second opening 132 may be formed in the sacrificial layer 120 over the first region I. The second opening 132 may expose a portion of the surface of the first pattern material layer 110.

In one embodiment, the second opening 132 may have a second projection on the to-be-etched layer 100, and a width B of the second projection in the first direction X may be in a range of approximately 30 nm-50 nm.

If the width B is too small, the second opening may not cooperate with the first opening to form a large-sized first pattern layer. If the width B is too large, after exposing a photoresist material layer for forming the second opening 132, the pattern accuracy of the obtained photoresist layer may be substantially poor, such that the formed second opening 132 may not have desired accuracy and topography. Therefore, the second opening with a width B in an appropriate range may cooperate with the first opening 131 to form the large-sized first pattern layer, and at the same time, may have desired accuracy and topography.

In one embodiment, the first projection and the second projection may be arranged at intervals in the first direction X, and a distance between the first projection and the second projection may be less than approximately 20 nm.

Because the first projection and the second projection are arranged at intervals in the first direction X, and the distance between the first projection and the second projection is less than approximately 20 nm, a distance between the first opening 131 and the second opening 132 may be substantially small. Therefore, when forming the first doped region M and the second doped region N, the diffusion of doped ions may connect the first doped region M and the second doped region N.

In one embodiment, forming the second opening 132 may include: after forming the first barrier layer 140, forming a third pattern layer (not illustrated) on the surfaces of the first barrier layer 140 and the sacrificial layer 120, where the third pattern layer exposes a portion of the surface of the sacrificial layer 120 over the first region I; and using the third pattern layer as a mask, etching the sacrificial layer 120 until the surface of the first pattern material layer 110 is exposed.

In one embodiment, the third pattern layer may be made of photoresist. Forming the third pattern layer may include: forming a second photoresist material layer (not illustrated) on the sacrificial layer 120, and exposing and developing the second photoresist material layer to remove a portion of the second photoresist material layer on the sacrificial layer 120 over the first region I, to form the third pattern layer.

Etching the sacrificial layer 120 may include a dry etching process, a wet etching process, or a combination thereof. In one embodiment, etching the sacrificial layer 120 may include a dry etching process. In one embodiment, after forming the second opening 132, the third pattern layer may be removed. Removing the third pattern layer may include an ashing process.

In another embodiment, the first projection and the second projection may be arranged along the first direction, and the first projection may partially overlap the second projection. Further, in the first direction, a distance between the edges of the overlapped portion of the first projection and the second projection may be less than approximately 20 nm.

The first projection and the second projection may be arranged along the first direction X, and the first projection may partially overlap the second projection. Further, in the first direction X, a distance between the edges of the overlapped portion of the first projection and the second projection may be less than approximately 20 nm. Therefore, on the one hand, a first pattern layer with a pattern size larger than the pattern size of the first opening or the second opening may be subsequently formed; and on the other hand, the maximum size of the first pattern layer may be controlled, thereby forming a first pattern layer with an appropriate pattern size.

In another embodiment, forming the second opening may include: after forming the first barrier layer, forming a third pattern layer on the surfaces of the first barrier layer and the sacrificial layer, where the third pattern layer may expose a portion of the surface of the sacrificial layer over the first region and a portion of the surface of the first barrier layer, and the exposed surface of the sacrificial layer may be connected to the exposed surface of the first barrier layer; and using the third pattern layer as a mask, etching the sacrificial layer until the surface of the first pattern material layer is exposed.

Figure 8:
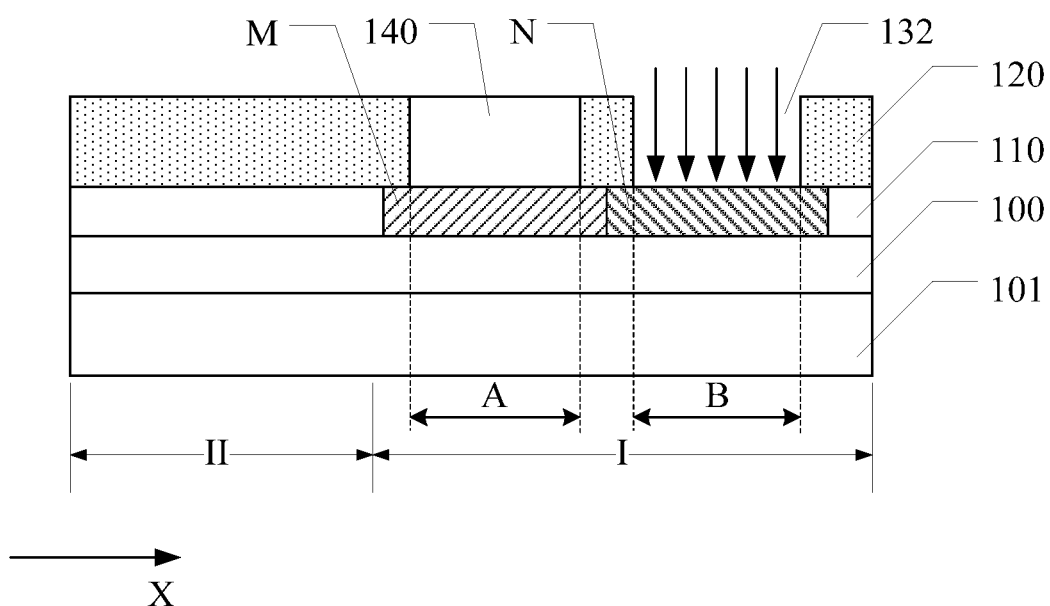

Returning to FIG. 13, after forming the second opening, a second doped region may be formed (S107). FIG. 8 illustrates a corresponding semiconductor structure.

Referring to FIG. 8, after forming the second opening 132, using the sacrificial layer 120 as a mask, a second doped region N may be formed in the first pattern material layer 110. The second doped region N may be connected to the first doped region M.

The first opening 131 and the second opening 132 may be formed, and the first doped region M and the second doped region N that are connected to each other may be formed through the first opening 131 and the second opening 132. Therefore, in the first direction X, the first doped region M may be connected to the second doped region N. Through the small-sized first opening 131 and the second opening 132, a mask with a large size in the first direction X, i.e., the first pattern layer including the first doped region M and the second doped region N, may be subsequently formed. Therefore, the pattern having a large size in the first direction X may be transferred to the to-be-etched layer 100.

Further, because the first opening 131 and the second opening 132 have a substantially small size in the first direction X, when forming the pattern layer of the first opening 131 and the second opening 132 by exposing the photoresist layer through an exposure step, the obtained pattern layer may have a substantially high-precision. Therefore, the formed first opening 131 and the second opening 132 may have high pattern accuracy and desired topography. The first doped region M and the second doped region N formed through the first opening 131 and the second opening 132 may have high pattern accuracy and desired topography. In other words, the subsequently formed first pattern layer including the first doped region M and the second doped region N may have high pattern accuracy and desired topography, thereby improving the accuracy of the pattern transferred to the to-be-etched layer 100, and improving the device performance of the semiconductor structure.

It should be noted that the connection between the first doped region M and the second doped region N may refer to that the boundaries of the first doped region M and the second doped region N may be in contact, or the first doped region M may partially overlap the second doped region N.

Forming the second doped region N may include a second ion implantation process. Parameters of the second ion implantation process may include doping ions including boron ions, boron fluoride ions, indium ions, phosphorus ions, arsenic ions, antimony ions, or a combination thereof. Therefore, the ions doped in the second doped region N may include boron ions, boron fluoride ions, indium ions, phosphorus ions, arsenic ions, antimony ions, or a combination thereof. The type of ions doped in the second doped region N may be the same as the type of ions doped in the first doped region M.

In one embodiment, by adjusting the process parameters of the second ion implantation process and the size of the second opening 132, the second doped region N with a design required size may be formed.

Figure 9:
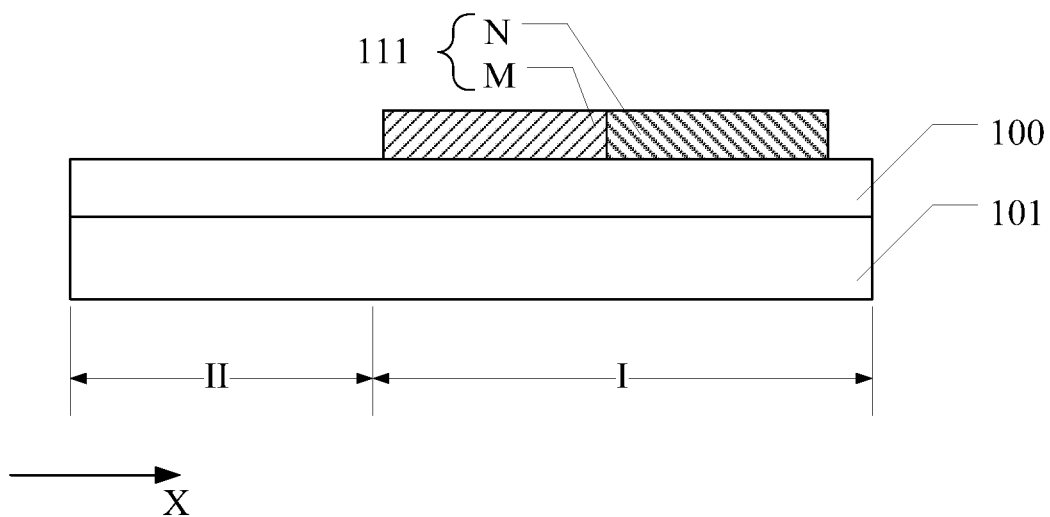

Returning to FIG. 13, after forming the second doped region, a first pattern layer may be formed (S108). FIG. 9 illustrates a corresponding semiconductor structure.

Referring to FIG. 9, after forming the second doped region N, the sacrificial layer 120 may be removed. After removing the sacrificial layer 120, a first pattern layer 111 may be formed. The first pattern layer 111 may include the first doped region M and the second doped region N, and the first pattern layer 111 may be located over the first region of the to-be-etched layer 100.

In another embodiment, the first pattern layer may further include a third doped region. The method for forming the third doped region may be the same as the method for forming the second doped region, which may not be repeated herein. Because the third doped region is formed, the first pattern layer with a substantially large size in the first direction X may be formed.

In certain embodiments, the first pattern layer may further include a plurality of fourth doped regions, and a quantity of the fourth doped regions may be adjusted according to the size of the to-be-formed first pattern layer. In other words, the quantity of the fourth doped regions may be adjusted according to the size of the pattern that needs to be subsequently transferred to the to-be-etched layer. The method for forming the fourth doped region may be the same as the method for forming the second doped region, which may not be repeated herein. Because the plurality of fourth doped regions are formed, the first pattern layer with a substantially large size in the first direction X may be formed.

Removing the sacrificial layer 120 may include an etching process, a planarization process, or a combination thereof.

In one embodiment, after removing the sacrificial layer 120 and before forming the first pattern layer 111, a surface cleaning process may be performed on the first pattern material layer 110. Therefore, the residue on the surface of the first pattern material layer 110 may be removed, which may prevent the residue from contaminating the surface of the to-be-etched layer after subsequently etching the to-be-etched layer 100. Therefore, the residue contamination issue of the semiconductor device may be reduced, and the device performance of semiconductor device may be improved. In one embodiment, a solution for performing the surface cleaning process on the first pattern material layer 110 may include sulfuric acid.

Forming the first pattern layer 111 may include after removing the sacrificial layer 120, etching the first pattern material layer 110. Etching the first pattern material layer 110 may include a wet etching process. Because the first doped region M and the second doped region N are doped with ions, the wet etching process may have an etching rate of the first pattern material layer 110 higher than an etching rate of the first doped region M and the second doped region N. Therefore, while retaining the first doped region M and the second doped region N, the remaining portion of the first pattern material layer 111 may be removed to form the first pattern layer 111. In one embodiment, an etching solution of the wet etching process may include ammonia.

Figure 10:
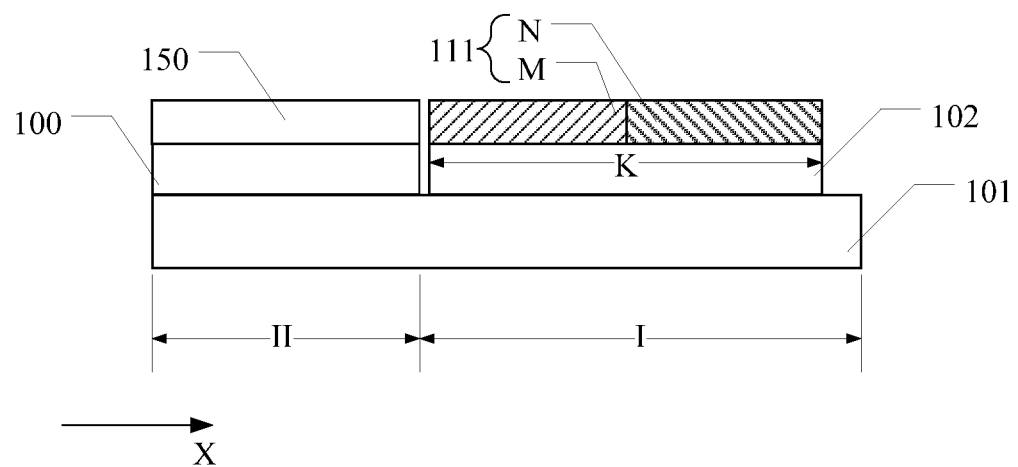

Returning to FIG. 13, after forming the first pattern layer, an etched pattern layer over the first region may be formed (S109). FIG. 10 illustrates a corresponding semiconductor structure.

Referring to FIG. 10, using the first pattern layer 111 as a mask, the first region I of the to-be-etched layer 100 may be etched to form an etched pattern layer 102. In one embodiment, the etched pattern layer 102 may have a width K in the first direction X, and the width K may be greater than approximately 50 nm. Etching the first region I of the to-be-etched layer 100 may include a dry etching process, a wet etching process, or a combination thereof.

In one embodiment, before etching the first region I of the to-be-etched layer 100, a first barrier layer 150 may be formed over the second region II of the to-be-etched layer 100. Therefore, the etching process for etching the first region I of the to-be-etched layer 100 may be prevented from affecting the second region II of the to-be-etched layer 100. In one embodiment, after forming the etched pattern layer 102, the first pattern layer 111 may be removed.

Returning to FIG. 13, after forming the etched pattern layer in the first region, an etched pattern layer in the second region may be formed (S110). FIGS. 11-12 illustrate a corresponding semiconductor structure.

FIG. 12 illustrates a top-view of a structure in FIG. 11. Referring to FIGS. 11-12, after forming the etched pattern layer 102, a fourth pattern layer (not illustrated) may be formed over the second region II of the to-be-etched layer 100 in. Using the fourth pattern layer as a mask, the second region II of the to-be-etched layer 100 may be etched to form an etched pattern layer 103.

Etching the second region II of the to-be-etched layer 100 may include a wet etching process, a dry etching process, or a combination thereof. In one embodiment, the fourth pattern layer may be made of photoresist. In one embodiment, after forming the etched pattern layer 103, the fourth pattern layer may be removed. Removing the fourth pattern layer may include an ashing process.

In one embodiment, after removing the first pattern layer 111, the fourth pattern layer may be formed. Further, after removing the first pattern layer 111 and before forming the fourth pattern layer, a second barrier layer (not illustrated) may be formed on the exposed surface of the substrate 101 and on the etched pattern layer 102. Therefore, the subsequent process for forming the etched pattern layer 103 may be prevented from affecting the exposed surface of the substrate 101 and the etched pattern layer 102.

In one embodiment, forming the fourth pattern layer may include after forming the second barrier layer, removing the first barrier layer 150 over the second region II of the to-be-etched layer 100; after removing the first barrier layer 150, forming a fourth pattern material layer over the second region II of the surface of the to-be-etched layer 100; and exposing and developing the fourth pattern material layer to form the fourth pattern layer. In one embodiment, after forming the etched pattern layer 103, the second barrier layer may be removed.

In one embodiment, in a second direction Y perpendicular to the first direction X, a projection of the fourth pattern layer on the to-be-etched layer 100 may have a first length T, and the first length T may be greater than approximately 50 nm. Therefore, the etched pattern layer 103 may also have the first length T greater than approximately 50 nm in the second direction Y.

In one embodiment, the etched pattern layer 103 may have a width S in the first direction X, and both the first length T and the width K may be much larger than the width S. In one embodiment, the etched pattern layer 102 may have a second length W in the second direction Y, and the width K may be much larger than the second length W.

Therefore, the etched pattern layer 102 may have a type different from the etched pattern layer 103. The etched pattern layer 102 may have a substantially large size in the first direction X and a substantially small size in the second direction Y, while the etched pattern layer 103 may have a substantially small size in the first direction X and a substantially large size in the second direction Y.

Therefore, through the above-mentioned fabrication method, the etched pattern layer 102 and the etched pattern layer 103 with high pattern accuracy and desired topography may be formed at the same time. In other words, while adjusting the exposure process for the etched pattern layer 103 (the exposure process may have a high accuracy and substantially large exposure range in the second direction Y, and may have a poor accuracy and substantially small exposure range in the first direction X), the etched pattern layer 102 having a substantially large size in the first direction X may also be taken into consideration.

Correspondingly, the present disclosure also provides a semiconductor structure formed by any one of the above-disclosed methods.

The disclosed embodiments may have following beneficial effects. In the disclosed method for forming the semiconductor device, the first opening and the second opening may be formed, and the first doped region and the second doped region that are connected to each other may be formed through the first opening and the second opening. Therefore, in an extension direction where the first doped region is connected to the second doped region, through the small-sized first opening and the second opening, a mask with a large size in the extension direction, i.e., the mask including the first doped region and the second doped region, may be subsequently formed. Therefore, the pattern having a large size in the extension direction may be transferred to the to-be-etched layer.

Further, because the first opening and the second opening have a substantially small size in the first direction, when forming the pattern layer of the first opening and the second opening by exposing the photoresist layer through an exposure step, the obtained pattern layer may have a substantially high-precision. Therefore, the formed first opening and the second opening may have high pattern accuracy and desired topography. The first doped region and the second doped region formed through the first opening and the second opening may have high pattern accuracy and desired topography. In other words, the subsequently formed first pattern layer including the first doped region and the second doped region may have high pattern accuracy and desired topography, thereby improving the accuracy of the pattern transferred to the to-be-etched layer, and improving the device performance of the semiconductor structure.

Further, because the first projection and the second projection are arranged at intervals in the first direction, and the distance between the first projection and the second projection is less than approximately 20 nm, a distance between the first opening and the second opening may be substantially small. Therefore, when forming the first doped region and the second doped region, the diffusion of doped ions may connect the first doped region and the second doped region.

The first projection and the second projection may be arranged along the first direction, and the first projection may partially overlap the second projection. Further, in the first direction, a distance between the edges of the overlapped portion of the first projection and the second projection may be less than approximately 20 nm. Therefore, on the one hand, a mask layer with a pattern size larger than the pattern size of the first opening or the second opening may be subsequently formed; and on the other hand, the maximum size of the mask layer may be controlled, thereby forming a mask layer with an appropriate pattern size.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for forming a semiconductor structure, comprising:

providing a to-be-etched layer, wherein the to-be-etched layer includes a first region;

forming a first pattern material layer on the to-be-etched layer;

forming a sacrificial layer on the first pattern material layer;

forming a first opening in the sacrificial layer over the first region of the to-be-etched layer, wherein the first opening exposes a first portion of a surface of the first pattern material layer over the first region;

after forming the first opening, forming a first doped region in the first pattern material layer using the sacrificial layer as a mask;

after forming the first doped region, forming a second opening in the sacrificial layer over the first region of the to-be-etched layer, wherein the second opening exposes a second portion of the surface of the first pattern material layer over the first region;

after forming the second opening, forming a second doped region in the first pattern material layer using the sacrificial layer as a mask, wherein the second doped region is connected with the first doped regions;

after forming the second doped region, removing the sacrificial layer;

after removing the sacrificial layer, forming a first pattern layer, wherein the first pattern layer includes the first doped region and the second doped region, and the first pattern layer is located over the first region of the to-be-etched layer; and etching the first region of the to-be-etched layer using the first pattern layer as a mask.

2. The method according to claim 1, wherein forming the first opening includes:

forming a second pattern layer on the sacrificial layer, wherein the second pattern layer exposes a first portion of a surface of the sacrificial layer over the first region; and using the second pattern layer as a mask, etching the sacrificial layer until the surface of the first pattern material layer is exposed.

3. The method according to claim 1, wherein forming the second opening includes:

after forming the first doped region, forming a first barrier layer in the first opening;

after forming the first bather layer, forming a third pattern layer on surfaces of the first barrier layer and the sacrificial layer, wherein the third pattern layer exposes a second portion of a surface of the sacrificial layer over the first region; and using the third pattern layer as a mask, etching the sacrificial layer until the surface of the first pattern material layer is exposed.

4. The method according to claim 1, wherein forming the second opening includes:

after forming the first doped region, forming a first bather layer in the first opening;

after forming the first bather layer, forming a third pattern layer on surfaces of the first barrier layer and the sacrificial layer, wherein the third pattern layer exposes a second portion of a surface of the sacrificial layer over the first region and a portion of the surface of the first barrier layer, and the exposed surface of the sacrificial layer is connected with the exposed surface of the first barrier layer; and using the third pattern layer as a mask, etching the sacrificial layer until the surface of the first pattern material layer is exposed.

5. The method according to claim 1, after removing the sacrificial layer and before forming the first pattern layer, further including:

performing a surface cleaning process on the first pattern material layer.

6. The method according to claim 1, wherein forming the first pattern layer includes:

after removing the sacrificial layer, etching the first pattern material layer.

7. The method according to claim 6, wherein:

etching the first pattern material layer includes a wet etching process; and the wet etching process has an etching rate of the first pattern material layer higher than an etching rate of the first doped region and the second doped region.

8. The method according to claim 1, wherein:

forming the first doped region includes a first ion implantation process.

9. The method according to claim 1, wherein:

forming the second doped region includes a second ion implantation process.

10. The method according to claim 1, wherein:

a type of ions doped in the first doped region is same as a type of ions doped in the second doped region.

11. The method according to claim 1, wherein:

the first opening has a first projection on the to-be-etched layer; and the second opening has a second projection on the to-be-etched layer, wherein:

the first projection and the second projection are arranged at intervals along a first direction, and a distance between the first projection and the second projection is less than approximately 20 nm.

12. The method according to claim 1, wherein:

the first opening has a first projection on the to-be-etched layer; and the second opening has a second projection on the to-be-etched layer, wherein:

the first projection and the second projection are arranged along a first direction, the first projection partially overlaps the second projection, and in the first direction, a distance between edges of an overlapped portion of the first projection and the second projection is less than approximately 20 nm.

13. The method according to claim 11, wherein:

in the first direction, a width of the first projection is in a range of approximately 30 nm-50 nm, and a width of the second projection is in a range of approximately 30 nm-50 nm.

14. The method according to claim 11, wherein:

the to-be-etched layer further includes a second region, wherein the method further includes:

forming a fourth pattern layer over the second region of the to-be-etched layer, wherein in a second direction perpendicular to the first direction, a projection of the fourth pattern layer on the to-be-etched layer has a first length, and the first length is greater than approximately 50 nm, and using the fourth pattern layer as a mask, etching the second region of to-be-etched layer.

15. The method according to claim 1, wherein:

the sacrificial layer includes a sacrificial bather layer on the first pattern material layer, and an anti-reflection layer on the sacrificial bather layer.

16. The method according to claim 1, wherein:

the first pattern material layer is made of a material including photoresist.

17. The method according to claim 1, wherein:

ions doped in the first doped region include boron ions, boron fluoride ions, indium ions, phosphorus ions, arsenic ions, antimony ions, or a combination thereof; and ions doped in the second doped region include boron ions, boron fluoride ions, indium ions, phosphorus ions, arsenic ions, antimony ions, or a combination thereof.

18. The method according to claim 1, wherein:

the first pattern layer further includes a third doped region.

* * * * *